United States Patent [19] [11] Patent Number: 4,745,393
Tsukada et al. [45] Date of Patent: May 17, 1988

[54] ANALOG-TO-DIGITAL CONVERTER

[75] Inventors: Toshiro Tsukada, Hachioji; Seiichi Ueda, Takasaki; Tatsuji Matsuura, Tokyo; Yuichi Nakatani, Mitaka; Eiki Imaizumi, Fuchu, all of Japan

[73] Assignees: Hitachi, Ltd; Hitachi VLSI Engineering Corp., both of Tokyo, Japan

[21] Appl. No.: 911,154

[22] Filed: Sep. 24, 1986

[30] Foreign Application Priority Data

Sep. 25, 1985 [JP] Japan ................................ 60-210012
Sep. 25, 1985 [JP] Japan ................................ 60-210013

[51] Int. Cl.⁴ ............................................. H03M 1/36
[52] U.S. Cl. ............................................. 340/347 AD
[58] Field of Search ................................. 340/347 AD

[56] References Cited

U.S. PATENT DOCUMENTS 4,417,233 11/1983 Inoue ........................... 340/347 AD
4,612,531 9/1986 Dingwall ..................... 340/347 AD

FOREIGN PATENT DOCUMENTS 2082410 3/1982 United Kingdom ........ 340/347 AD

Primary Examiner—Charles D. Miller
Attorney, Agent, or Firm—Antonelli, Terry & Wands

[57] ABSTRACT

In a serial-parallel A/D converter, at least two sets of comparators are provided for the conversion of the low-order bits and are operated in a cyclic fashion. Since the subsequent input can be subjected to the A/D conversion without waiting for the determination of the low-order bits, the conversion speed is increased.

12 Claims, 16 Drawing Sheets

ANALOG-TO-DIGITAL CONVERTER

BACKGROUND OF THE INVENTION

The present invention relates to an analog-to-digital (A/D) converter, and in particular to a serial-parallel (or sub-range type) A/D converter.

To classify an analog input into $2^m$ an A/D converter, it is only necessary to use comparators corresponding to $2^m-1$ boundary values. The parallel A/D converter conforms to this concept. Since all comparators can be simultaneously operated, a high conversion speed is developed. However, as the number of bits increases, the number of comparators becomes greater, which leads to problems in that both the number of devices and the power dissipation are increased.

As an apparatus for decreasing the number of comparators required for an A/D converter, a serial-parallel A/D converter has been proposed. For example, when a desired digital signal comprises 2n bits, a course A/D conversion is first conducted on the n high-order bits, a fine A/D conversion is carried out on the n low-order bits, and then the results of the coarse and fine A/D conversion operations are combined, thereby obtaining an objective result comprising 2n bits. In this case, $2^{2n}-1$ comparators are required for a parallel A/D conversion, whereas only $2 \cdot (2^n-1) = 2^{n+1} - 2$ comparators are needed for a serial-parallel conversion. By increasing the number of serial stages, the number of required comparators can be further lowered. The reduction of the necessary number of compararors make it possible to decrease the number of devices and the power consumption. In the serial-parallel A/D conversion, the conversion must be repeatedly achieved as many times as there are the serial stages, and hence the conversion speed is lowered. Such a serial-parallel converter has been described, for example, in JP-A-57-131123 and 1985 IEEE International Solid-State Circuits Conference WPM 7.1 which are incorporated by reference.

For A/D converters, a differential MOS comparator and chopper MOS comparators are utilized in ordinary cases. The MOS device is characterized by a low control power, however, the differential circuit requires a constant-current power supply and the chopper circuit allows a current to flow therethrough during the autozero period. Moreover, when using a great number of comparators, the power consumed by these comparators cannot be considered to be quite low. The differential comparator and the chopper comparator have been described in the Digests of 1984 General Meeting of the Institute of Electronics and Communication Engineers of Japan, Communication Department, page 1-94, October 1984 and ISSCC 79 Digests of Technical Papers. pp. 126-127, 1979/2, respectively, which are incorporated herein by reference.

SUMMARY OF THE INVENTION

An object of this invention is to provide a serial-parallel A/D converter capable of a high speed operation.

Another object of this invention is to provide a serial-parallel A/D converter which is capable of performing operations with a very low power dissipation.

According to an aspect of this invention, an A/D conversion is performed through a plurality of stages and a plurality of analog input processing opertions are concurrently executed in some portions. For example, while a first analog input is being processed in a second stage, a second analog input is simultaneously being processed in a first stage. This concurrent processing prevents the compare operations increased in the serial-parallel conversion from directly elongating the processing time.

More particularly, a group of comparators used to compare at least the low-order bits are arranged in a parallel circuit configuration of a plurality of sets of comparators, the sets being operated in turn.

In addition, a comparator used in an A/D converter is favorably configured with switching elements connected in series, which are controlled by a clock pulse so that all the switching elements are not turned on at the same time. The current required is basically limited to the current necessary for charging and discharging capacitors, which greatly minimizes the power dissipation.

BRIEF DESCRIPTION OF THE DRAWINGS

The present invention will be apparent from the following detailed description taken in conjunction with the accompanying drawings in which.

DESCRIPTION OF THE PREFERRED EMBODIMENTS

To effect an A/D conversion on 2 bits, $2^m$ bits, $2^m - 1$ boundary values must be compared with the values inputted to the A/D converter. In a parallel A/D converter, an input signal is simultaneously compared with all the boundary values, which requires the same number of comparators as the number of boundary values. If the conversion is achieved through a plurality of stages, the necessary number of comparators can be minimized. When a 4-bit A/D conversion is executed by achieving the A/D conversion on two high-order bits and then on two low-order bits, there are required only six comparators, namely, three comparators for determining the two high-order bits and three comparators for determining the two low-order bits. In contrast, a 4-bit parallel A/D converter requires 15 comparators. In general, a $2^n$-bit parallel A/D comparator necessitates $2^{2n} - 1$ comparators. A serial-parallel converter constituted from an upper stage and a lower stage can be implemented by use of $2^{n+1} - 2$ comparators. For example, a parallel converter requires 1024 comparators for a 10-bit conversion (n=5), whereas a 2-stage serial-parallel converter necessitates only 62 comparators. The number of stages however is not limited to two. Since the size of the circuit of the serial-parallel converter can be minimized, the area required for the circuit and the power dissipation can be greatly reduced as compared with the parallel converter.

For easy understanding of the present invention, the conventional A/D converter will be described with reference to FIGS. 1–3.

Figure 1:
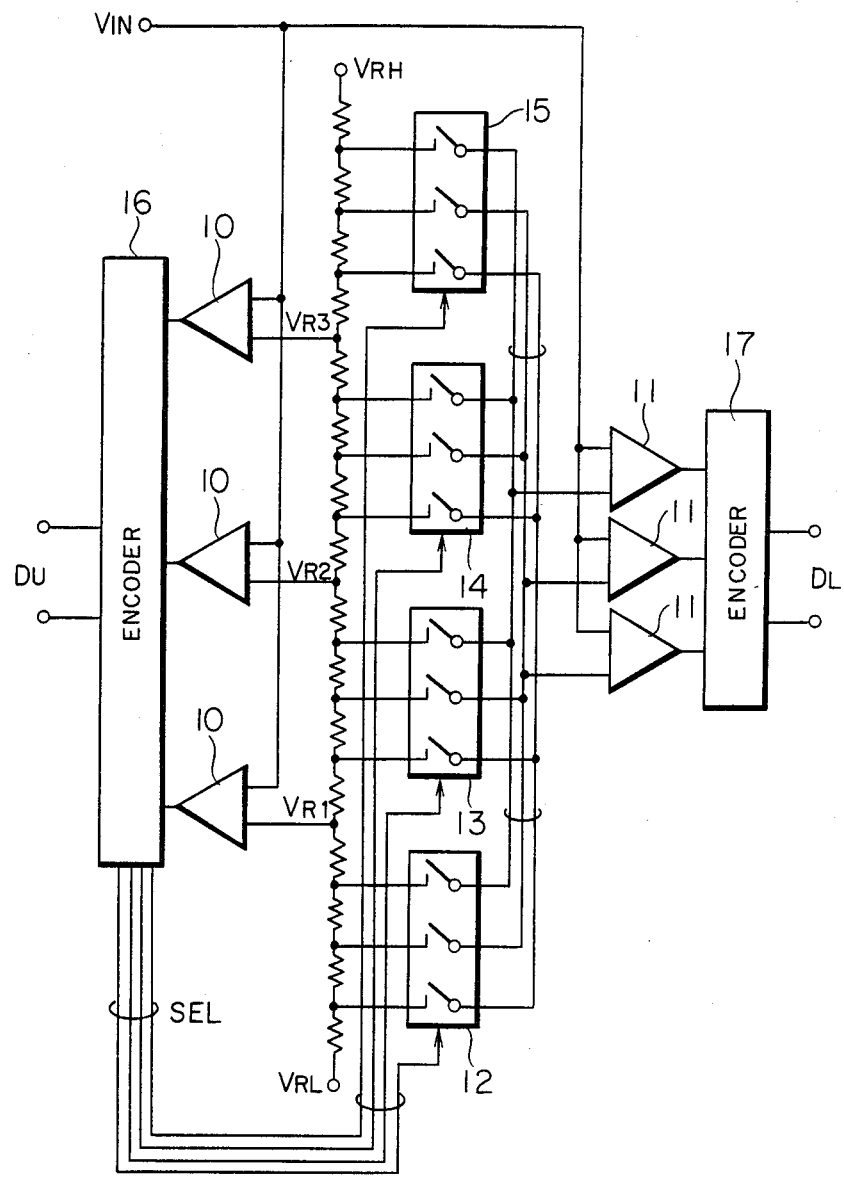
FIG. 1 is a schematic circuit diagram of the conventional serial-parallel A/D converter.

FIG. 1 shows an example of circuit configuration of the conventional serial-parallel A/D converter which is also called sub-range A/D converter. For simplicity, the digital signal is assumed to comprise four bits and the A/D conversion is to be accomplished through two stages for the two high-order bits and two low-order bits, respectively. First, three divided voltage values $V_{R1}$, $V_{R2}$, and $V_{R3}$ between an input voltage $V_{in}$ and reference voltage values $V_{RH}$ and $V_{RL}$ are simultaneously compared by use of three comparators 10. An encoder 16 converts the compare result into a 2-bit digital signal to determine two high-order bits $D_u$ (coarse conversion). The $D_u$ indicates one of four partitions to which the input analog signal belongs. To extract a 4-bit signal, each partition must be further divided into for sub-partitions. Based on the two high-order bits indicating the compare result, the encoder 16 outputs a signal SEL for selecting one of four switches 12–15. The selected switch circuit selectively supplies a fine division voltage to a low-order comparator. The input voltage $V_{in}$ is also being supplied to three low-order comparators 11 and is compared therein with each division voltage from a switch selected by use of the signal SEL. From the compare result, an encoder 17 determines two low-order bits $D_L$.

The comparators used in this configuration each is capable of keeping an input signal. FIG. 3 shows an example of a chopper comparator, whereas FIG. 2 is a timing chart of the A/D converter. An operation of the chopper comparator is effected through an autozero cycle and a compare cycle. In the autozero cycle, the inputs and outputs of inverters 30 and 31 are short-circuited by switches 32 and 33, respectively so as to automatically set the inverters to a zero point which is at an intermediate point between a high level and a low level, and at the same time, turns a switch 34 on to apply the input voltage $V_{in}$ to a capacitor C36, which is in turn charged up to the $V_{in}$. Next, in the compare cycle, the switches 32 and 33 are turned off to set the inverters 30 and 31 to the high amplification state, thereby turning the switch 35 on to apply the reference voltage $V_R$ to the capacitor C36. As a result, the difference voltage between $V_{in}$ and $V_R$ becomes the input signal, which is amplified by two stages of inverters 30–31 coupled in the sense of the alternate current, and an output Q from the inverter 31 of the final stage is stored in a latch 37. In this case, output Q=Low level for $V_{in} > V_R$ and output Q=High level for $V_{in} < V_R$.

Figure 2:
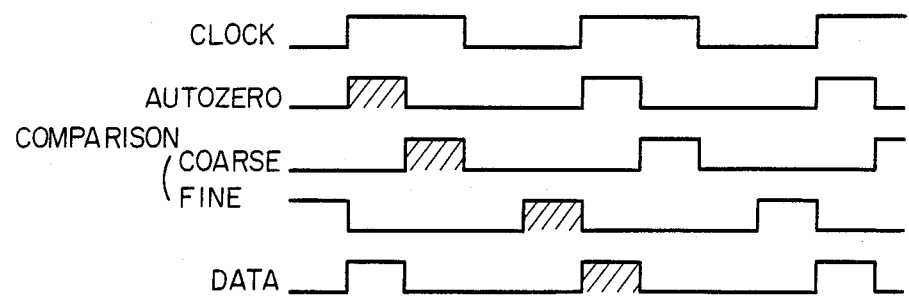
FIG. 2 is a timing chart showing the timing of operations in the circuit of FIG. 1.
Figure 3:
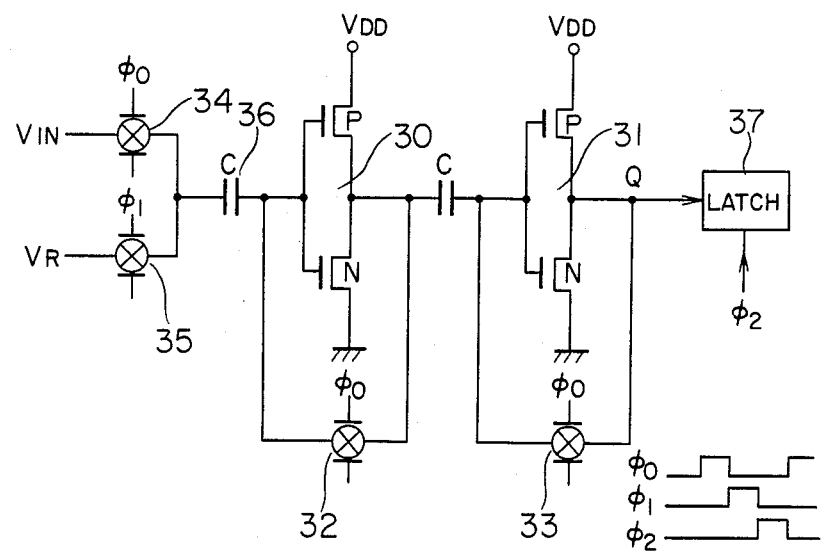
FIG. 3 is a circuit diagram of a chopper-type comparator.

Referring to FIGS. 1–2, in the autozero cycle (in which the AUTOZERO pulse is at the high level), the high-order and low-order comparators 10–11 receive the input voltage $V_{in}$. The high-order comparator 10 receives the predetermined reference voltage $V_R$ during the compare cycle of the high-order bit $D_u$ (in which the COARSE pulse is at the high level), whereas the low-order comparator 11 receives the reference voltage $V_R$ during the compare cycle of the low-order bit $D_L$ (in which the FINE pulse is at the high level); thereafter the comparators 10–11 each perform the voltage comparison between $V_R$ and $V_{in}$. As a result, all bits of the digital data of $V_{in}$ are outputted after the comparison result of the low-order bit $D_L$ is obtained, namely, during a period in which the DATA pulse is at the high level.

In a parallel A/D converter, since the high-order and low-order bits are simultaneously compared, the autozero and compare cycles can be alternately established, which makes it possible to extract the digital data for each cycle. That is, two compare operations shown in the timing chart of FIG. 2 can be accomplished by a compare operation and hence a high-speed conversion is achieved.

As described above, although the circuit size and power dissipation can be reduced by adopting the serial-parallel converter, the conversion speed in lowered. For example, when applying the serial-parallel A/D converter to the processing of a high-speed signal, the conversion speed has been required to be improved.

Figure 4:
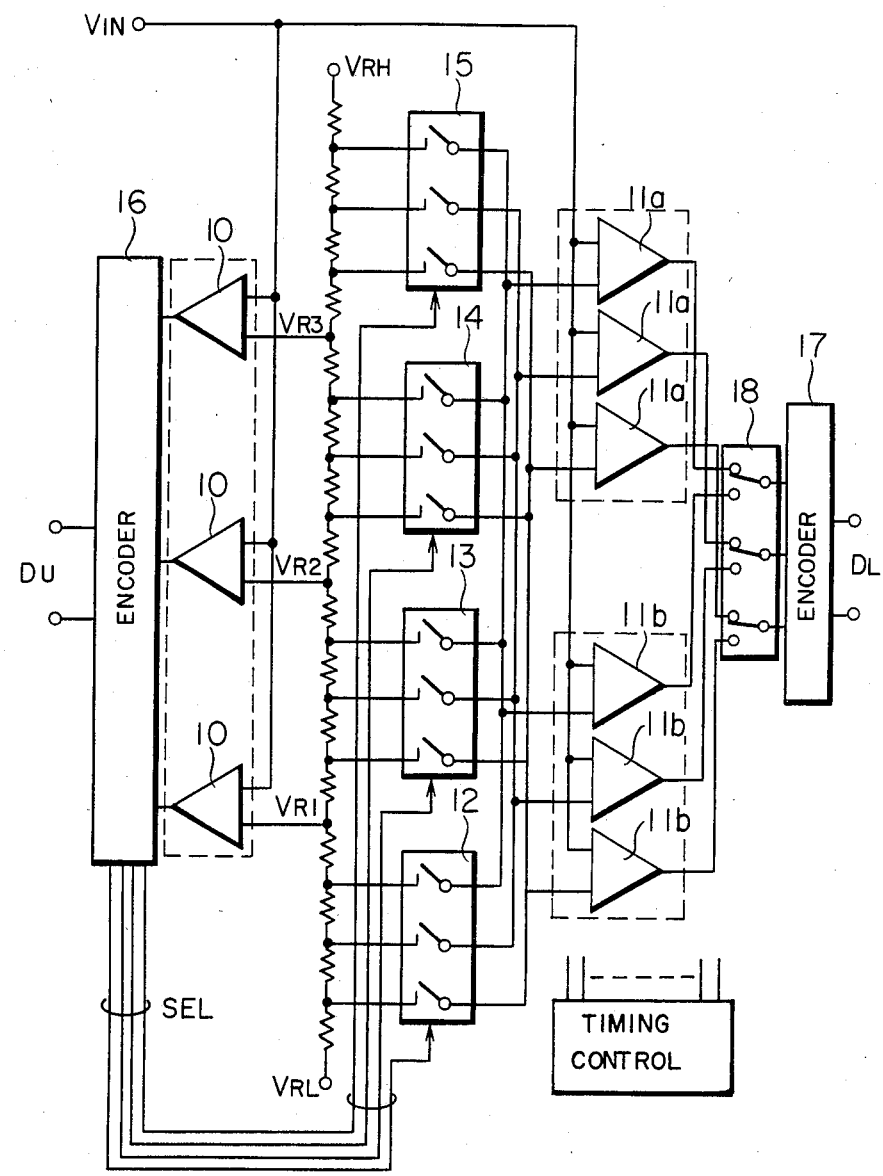
FIG. 4 is a circuit diagram of a serial-parallel A/D converter according to an embodiment of the present invention.
Figure 5:
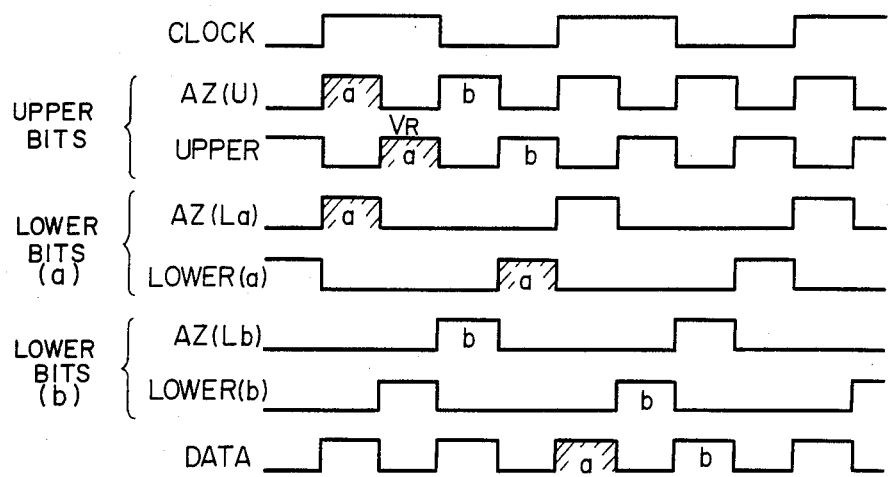
FIG. 5 is a timing chart showing the timing of operations in the circuit of FIG. 4.
Figure 6:
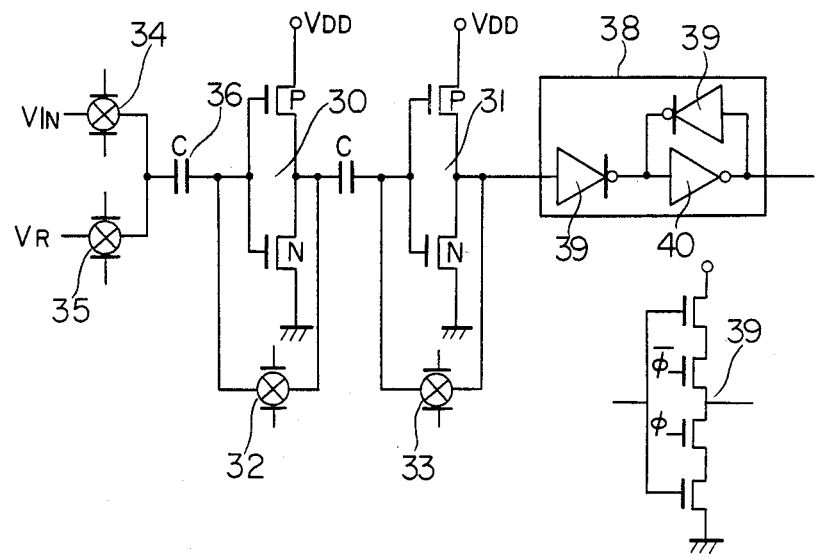
FIGS. 6–8 circuit diagrams illustrating circuit examples of comparators used in the A/D converter of FIG. 4.

FIGS. 4–6 show an embodiment of the present invention in which FIG. 4 depicts a circuit diagram, FIG. 5 illustrates a timing chart, and FIG. 6 demonstrates a configuration example of the comparator of FIG. 4.

For the simplicity of explanation, an example of a 4-bit (16-level) conversion will be described. The input voltage $V_{in}$ is determined to be at which one of 16 levels between the reference voltage values $V_{RH}$ and $V_{RL}$.

FIG. 4 is a circuit diagram illustrating the circuit configuration of the serial-parallel A/D converter according to the present invention. For simplicity, a 4-bit configuration will be described. In three comparators 10, the input voltage $V_{in}$ is simultaneously compared with three division voltage values divided by use of resistors. The compare result is encoded by the encoder 16 into the two high-order bits $D_u$. Based on the compare result from the comparators 10, the encoder 16 outputs a signal SEL for selecting one of four switches 12–15. The SEL signal is used to select some of the finely divided voltage values, and the selected voltage values are applied to the proper reference voltage terminals of the low-order comparators 11a–11b. In the three low-order comparators 11a or 11b, the input voltage $V_{in}$ is simultaneously compared with the selected division voltage value. The encoder 17 encodes the compare result into the two low-order bits $D_L$. The high-order and low-order bits $D_u$ and $D_L$ are combined to form a digital output.

If only a set of low-order comparators are provided, the subsequent operation of the high-order comparators cannot be started until the operation of the low-order comparators is finished. This is because the high-order and low-order comparators receive inputs at the same time. If the next input is received to initiate converting the high-order bits before the operation of the low-order comparators is finished, the low-order comparators cannot receive the next input. To set the operation of the low-order comparators in the wait state means that the conversion speed is low as described in conjunction with FIGS. 1–3. If a plurality of sets of low-order comparators are provided for operation in a preset sequence, the A/D conversion of the subsequent input signal can be started before the operation of the low-order comparators is completed. In an ordinary case, only two sets of low-order comparators are required; however, in such a case where a long period of time is elapsed between a data reception and an initiation of the operation of the low-order comparators, at least three sets of low-order comparators are preferably provided in some cases. As described above, the serial-parallel configuration can be applied to the A/D converter without deteriorating the conversion speed.

In FIG. 4, two sets of low-order comparators operate alternately in synchronism with the high-order comparators 10, and the compare output is alternately received by the encoder 17 via a group of switches 18.

The comparators of FIG. 4 each can keep a data input; for example, a chopper comparator of FIG. 6 may be used. The group of switches need only have a function to transfer a digital output from the comparator 11a or 11b to the encoder 17, namely, a multiplexer comprising logic gates is applicable. The circuit configuration and operation of the comparator of FIG. 6 are similar to those of the chopper comparator of FIG. 3; however, the latch circuit 38 includes a combination of two clocked inverters 39 (controlled by a clock signal) and an inverter 40 and operates in synchronism with the comparator so as to store the output therefrom. The latch circuit has a simple circuit configuration and is thus suitable for an integrated circuit.

FIG. 5 shows the operation timing of the serial-parallel A/D converter of FIG. 4.

The high-order comparators 10 perform an autozero operation according to an autozero signal AZ(U), and at the same time, effect a storing or sampling of the input voltage $V_{in}$. In response to a high-order bit compare signal UPPER, the reference voltage $V_{Ri}$ (i=1, 2, 3) is stored and is compared with $V_{in}$ to output the high-order bits. A low-order comparators 11a perform an autozero operation and a data sampling in reply to a first autozero signal and achieve a compare operation in response to a first low-order bit compare signal LOWER(a). For LOWER(a), the high-order comparators have already received the next data. Other low-order comparators 11b then execute an autozero operation and a sampling in response to a second autozero signal AZ(Lb), and the compare operation is achieved according to a second low-order bit compare signal LOWER(b). At this point, the next data items are already stored in the high-order comparator 10a and the low-order comparator 11a. These two sets of low-order comparators 11a and 11b alternately operate with opposite phases.

Figure 7:
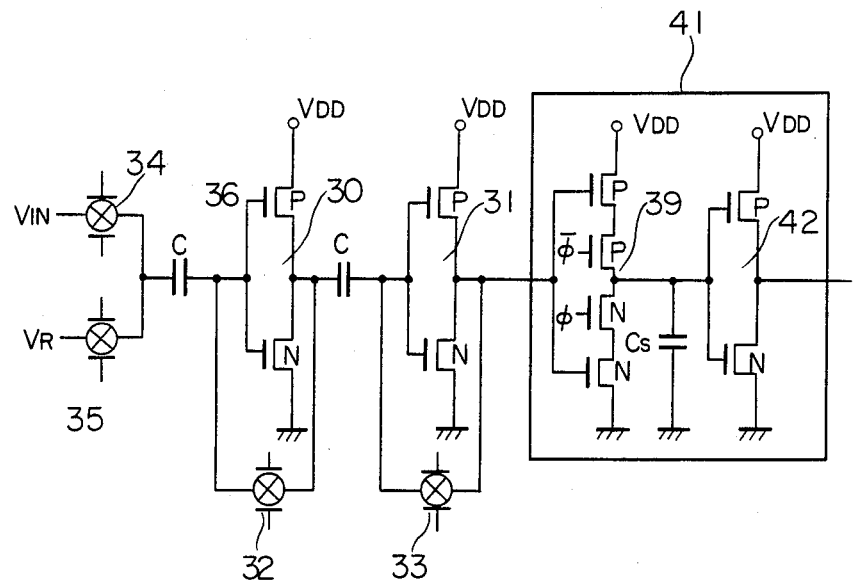

FIG. 7 shows another example of a comparator to be used in the serial-parallel A/D converter of FIG. 4. This circuit performs an operation similar to the operation of the chopper comparator of FIG. 6. In this example, a latch circuit 41 comprises a clocked inverter 39, a storage capacitor $C_S$, and an inverter 42. The storage capacitor $C_S$ may be formed only with a parasitic capacity including the gate capacity of the inverter 42. The latch circuit 41 has a simple circuit configuration and is suitable for an integrated circuit.

Figure 8:
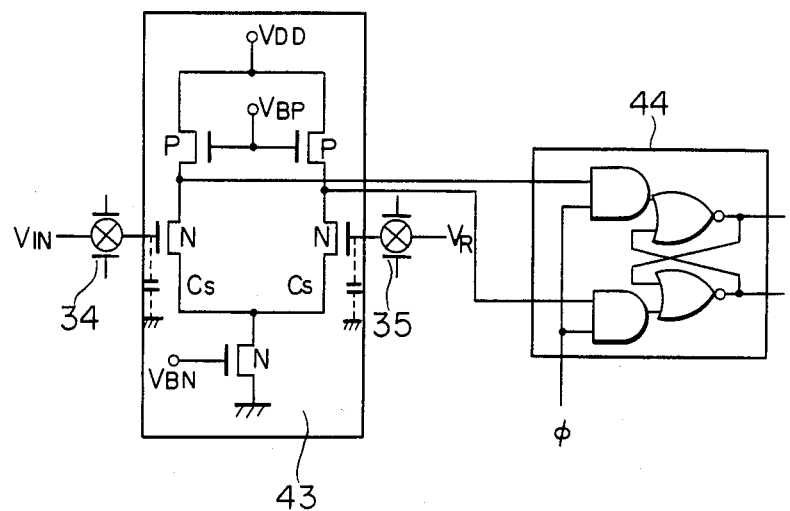

FIG. 8 is a circuit example of a comparator used in the series-parallel A/D converter of FIG. 4 in which the comparator comprises a differential amplifier. The input voltage $V_{IN}$ and the reference voltage $V_R$ received by the switches 34 and 35, respectively are sampled and held by capacitors $C_S$, $C_S$ at the input terminals of the differential amplifier 43, and then the difference voltage $V_{IN} - V_R$ is amplified and outputted. The output data is stored in a latch circuit comprising a composite logic gate. Two complementary outputs from the differential amplifier 43 are further amplified by the positive-feedback loop of the latch circuit 44, which makes at possible to obtain a sufficiently stable logic output.

In the embodiment of FIG. 4, the comparators each have a function to sample and to hold an input signal. Comparators not having the data hold function may be used together with a sample-and-hold circuit S/H provided for each set of comparators.

Figure 9:
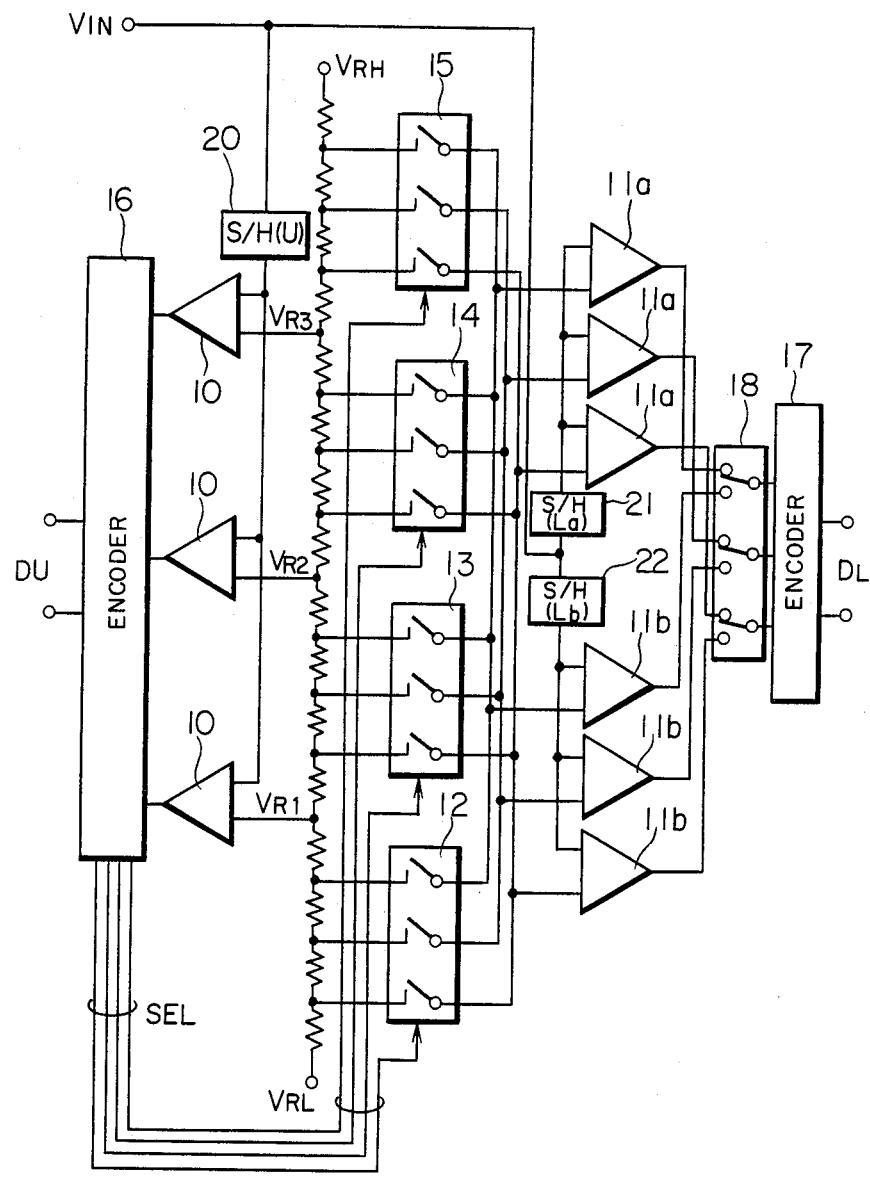
FIG. 9 is a circuit diagram of a serial-parallel A/D converter according to another embodiment of the present invention.

FIG. 9 shows a circuit diagram of the serial-parallel A/D converter according to another embodiment of the present invention. A set of high-order comparators 10 and two sets of low-order comparators 11a–11b each are provided with a sample-and-hold circuit. A sample-and-hold circuit S/H(U) is commonly linked to the input ports of three high-order comparators 10, whereas a sample-and-hold circuit S/H(La) 21 and a sample-and-hold circuit S/H(Lb) 22 are commonly linked to the input terminals of a set of three low-order comparators 11a and a set of three low-order comparators 11b, respectively, so that the input voltage $V_{in}$ is subjected to a sample-and-hold operation and then is supplied to each comparator.

Figure 10:
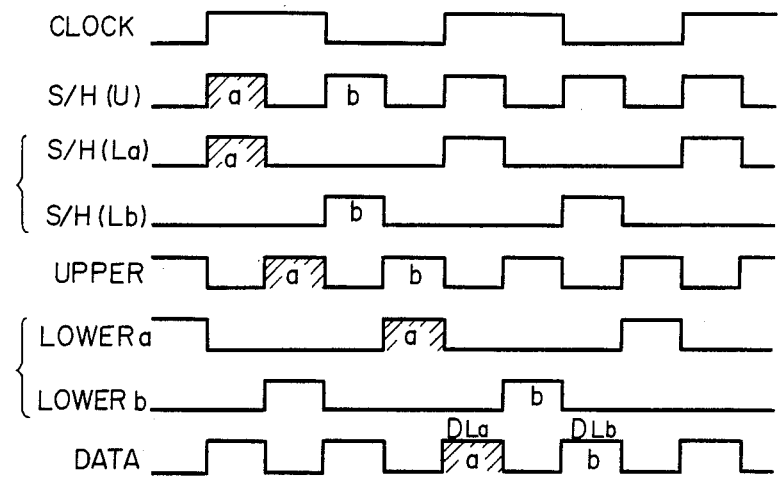
FIG. 10 is a timing chart showing the timing of operations in the circuit of FIG. 9.

In this serial-parallel A/D converter, the configuration of the other circuit sections are the same as that of FIG. 4. The operation of the converter is conducted according to the timing chart of FIG. 10.

The sample-and-hold circuits S/H (La) 21 and SH (Lb) 22 for the low-order bits alternately operate in synchronism with the sample-and-hold circuit SH(U)20 for the high-order bits. That is, the sample-and-hold circuit SH(La) 21 samples the input voltage $V_{in}$ while the sample-and-hold signal S/H(La) is at the high level and holds the input voltage $V_{in}$ while the sample-and-hold signal S/H(La) is at the low level. Similarly, the sample-and-hold circuit S/H (Lb) 22 effects a sample-and-hold operation on the input voltage $V_{in}$ according to the sample-and-hold signal S/H (Lb). The input voltage $V_{in}$ sampled by the sample-and-hold circuit 21 for the low-order bits is compared with a reference voltage selected while the signal LOWERa is at the high level (a), and the data $D_{La}$ of the low-order bits is outputted while the signal DATA is at the high level (shadowed portion a). On the other hand, the input voltage $V_{in}$ sampled by the sample-and-hold circuit 22 is compared with a reference voltage selected while the signal LOWERb is at the high level (b), and the data $D_{Lb}$ of the low-order bits is outputted while the signal DATA is at the high level (shadowed portion b). Since the data $D_{La}$ and $D_{Lb}$ of the low-order bits from the two sets of sample-sand-hold circuits, respectively are alternately outputted, the objective digital values resultant from the A/D conversion can be obtained at a higher speed as compared with the conventional serial-parallel A/D converter of FIG. 1.

Figure 11:
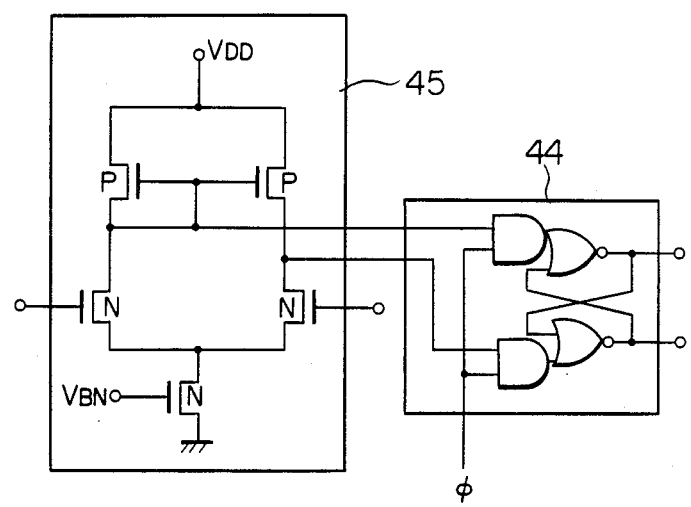
FIG. 11 is a circuit diagram illustrating an example of the circuit of the comparator used in the A/D converter of FIG. 9.

FIG. 11 shows a circuit example of a comparator not having the data hold function to be used in the serial-parallel A/D converter of FIG. 9. Since sample-and-hold circuits 20 - 22 are provided, the comparator can be configured with an ordinary differential amplifier 45 without necessitating the sample-and-hold function. The output from the differential amplifier 45 is stored in a latch 44 comprising logic gates. The comparator can be constructed with simple circuits requiring only one control clock and hence this circuit configuration is suitable for an integrated circuit.

Figure 12:
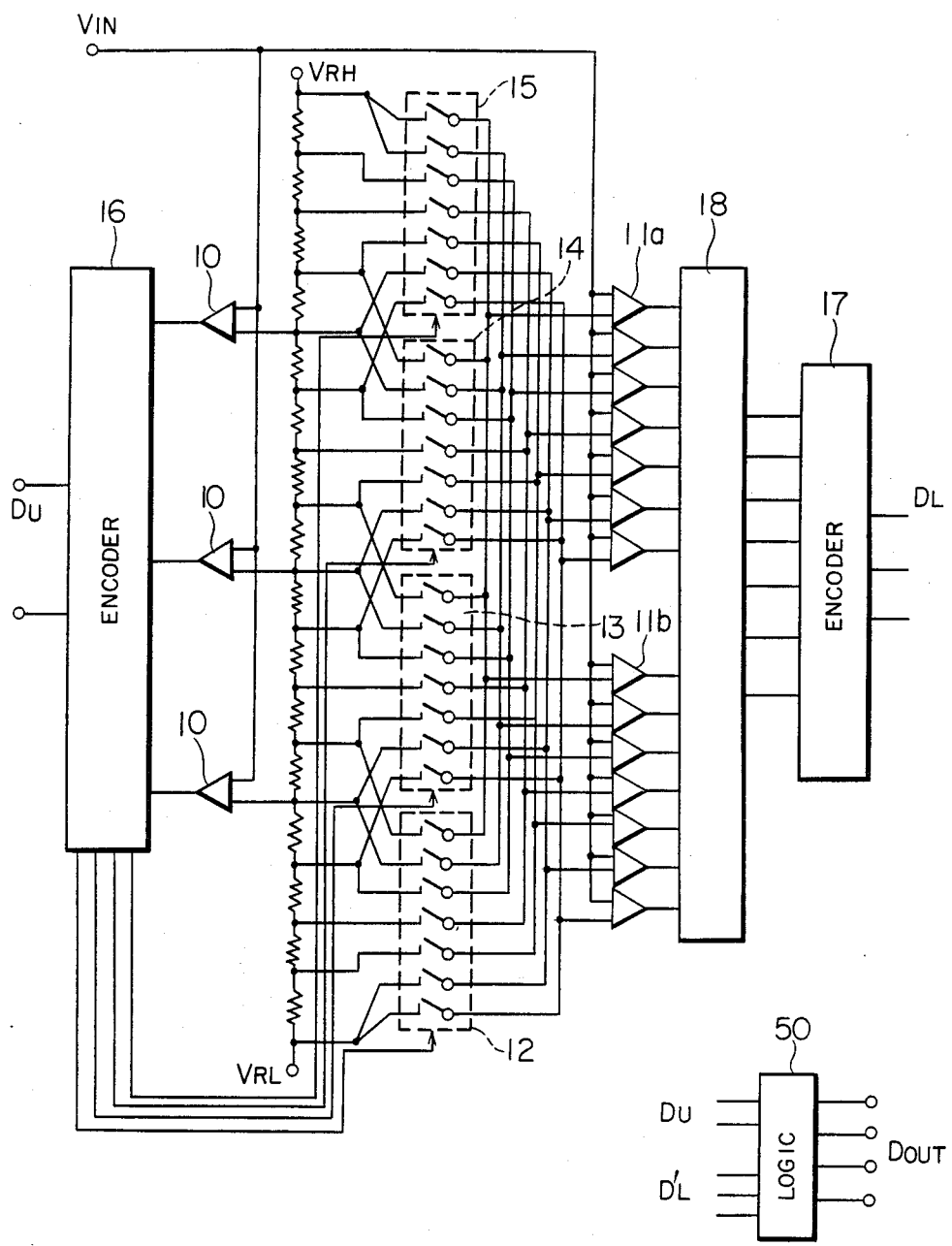
FIG. 12 is a circuit diagram showing an analog-to-digital (A/D) converter according to another embodiment of the present invention.

FIG. 12 shows an analog-to-digital converter according to another embodiment of the present invention. This circuit configuration comprises an increased number of comparators for the conversion of low-order bits so that the conversion of high-order bits and the conversion of low-order bits are concurrently achieved in some portions. The other features are similar to those of the embodiment of FIG. 4. In response to an output from the encoder 16 for the high-order bits, one of the select switch circuits 12-15 is selected. In FIG. 4, the switch circuits are used to select three divided voltages, however, these switches select seven divided voltages associated with three low-order bits in this embodiment. Namely, the voltage ranges each selected by the respective switch circuits are overlapped at the end portions thereof.

Since the voltage ranges for the low-order bit conversion is extended with respect to the lower and upper limits of each range, even if there exists a slight mismatch between the conversion circuit for the high-order bits and the conversion circuit for the low-order bits, the correct conversion result can be obtained. For example, let us assume that the switch circuit 13 has been mistakenly selected in place of switch circuit 14 due to the insufficient accuracy of the high-order comparators 10. In this case, the conversion of the low-order bits is not so meaningful in the circuit of FIG. 4. According to the present invention, even in this case, if the input voltage $V_{in}$ is in the extended voltage range, the comparison between the reference voltage and the input voltage $V_{in}$ is effectively conducted and hence the digital conversion value can be correctly extracted. In this case, the low-order data $D'_L$ which should comprise two bits may include three bits due to an overflow. The overflow bit need only be carried up to the high-order bits $D_u$, which is simply achievable by a logic circuit 50. To the contrary, assume that the comparators 10 have mistakenly selected the group of switches 14 in place of the group of switches 13. Also, in this case, if the input voltage $V_{in}$ is in the extended voltage range, the comparison of $V_{in}$ with the reference voltage is effectively accomplished to correctly obtain the digital conversion value. In this case, since the low-order data $D'_L$ is represented with three bits due to an underflow (associated with a negative value), the digital conversion value D can be obtained by simply effecting an addition or a subtraction between the high-order two-bit data $D_u$ and the low-order three-bit data $D'_L$. However, the method for generating the correct four bits from the combination of the configuration of three low-order bits and the two high-order bits is not restricted by this procedure.

As described above, according to the embodiment, the mismatching between the circuit operations for converting the high-order and low-order bits can be prevented in the serial-parallel A/D converter, and a highly-accurate A/D converter capable of effecting an A/D conversion without a malfunction can be implemented in an integrated circuit.

In the embodiment described above, only a set of comparators are used to process the high-order bits. If a higher-speed A/D conversion is necessary, the conversion of the high-order bits may also be sequentially achieved in a periodic fashion by use of a plurality of sets of comparators.

Figure 13:
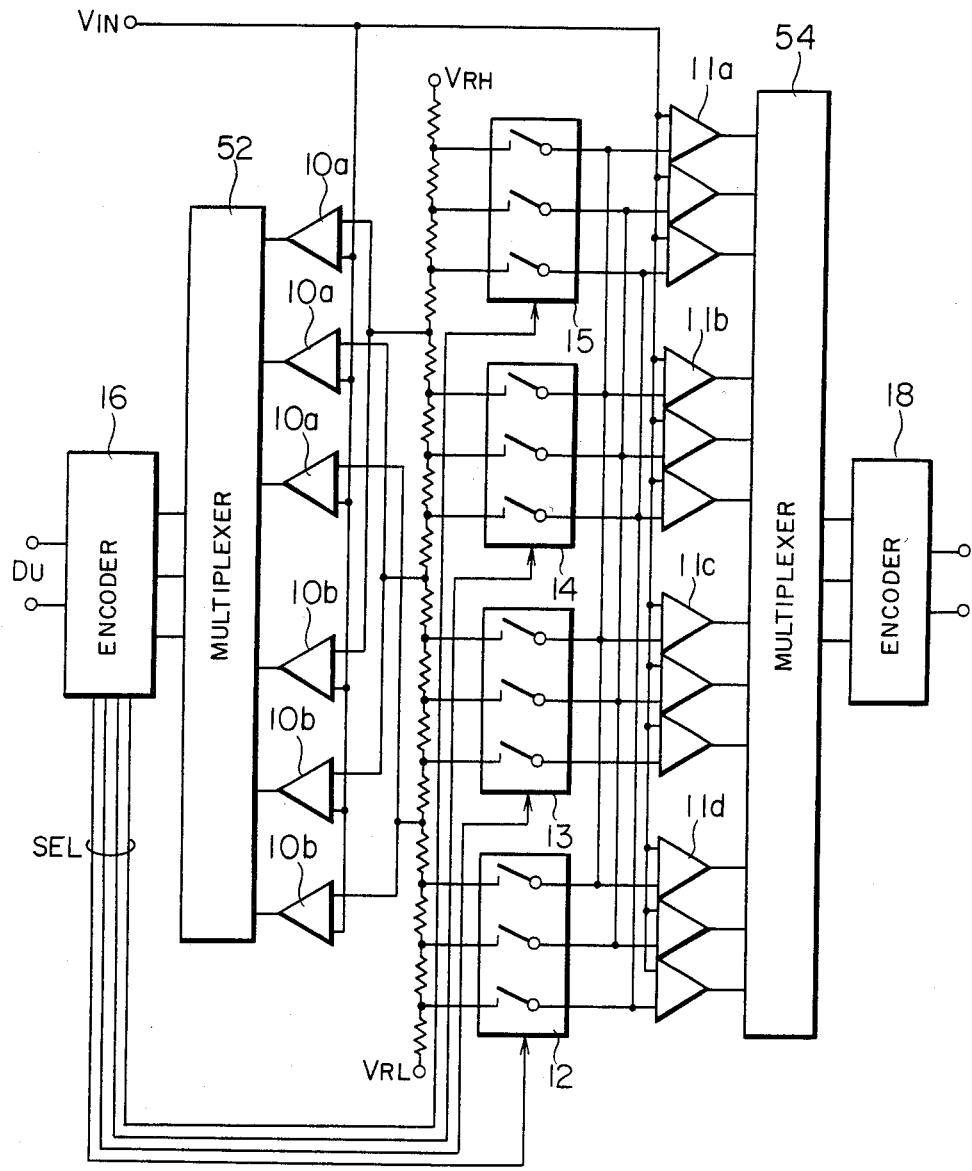
FIG. 13 is a circuit diagram illustrating an A/D converter according to another embodiment of the present invention.

FIG. 13 shows an A/D converter including two sets of comparators 10a and 10b for converting the high-order bits and four sets of comparators 11a, 11b, 11c, and 11d for converting the low-order bits. Each comparator has the data hold function. The multiplexers 52 and 54 sequentially receive data into the encoders 16 and 18, respectively so as to generate a digital output.

Figure 14:
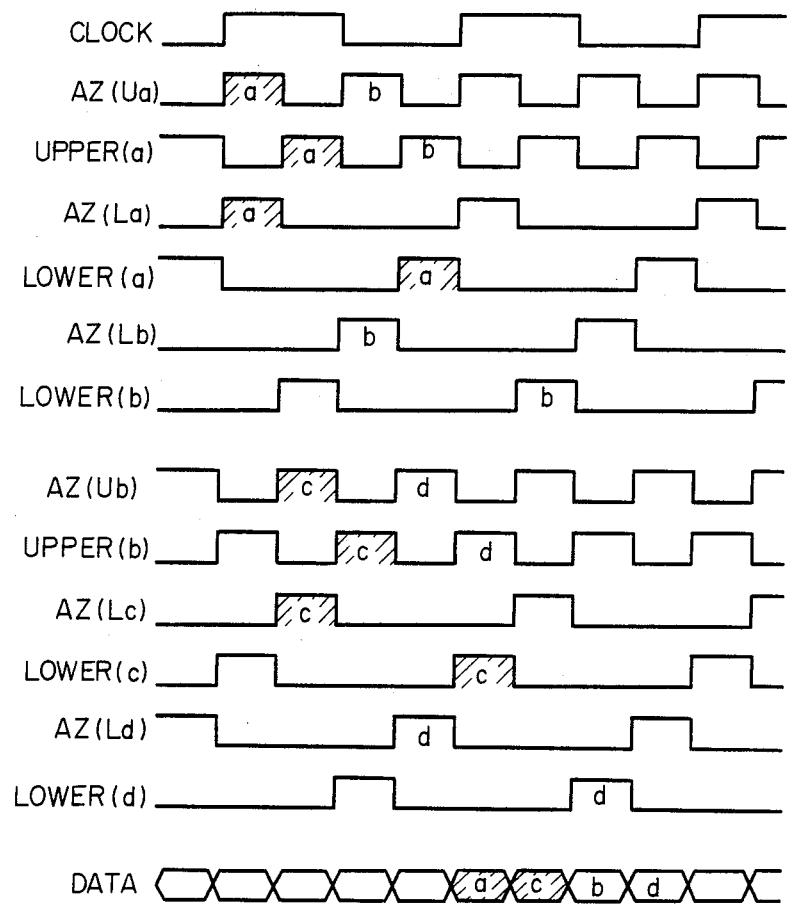
FIG. 14 is a timing chart showing the timing of operations in the circuit of FIG. 13.

FIG. 14 is the timing chart of the circuit of FIG. 13. Two sets of comparators 10a–10b for the high-order bits alternately operate to convert the upper bits of the input signal (UPPER(a) UPPER(b)). When the set of comparators 10a receives an input, the set of comparators 11a or 11b for the low-order bits simultaneously receives an input. Two sets of comparators 11a and 11b for the low-order bits alternately operate for the same comparator set 10a (AZ(La), LOWER(a); AZ(Lb), LOWER(b)). This is the same as for the set of comparators 10 for the high-order bits and the sets of comparators 11a–11b for the low-order bits shown in FIG. 4. In this example, while the autozero operation AZ(Ua) is in the halt state, the autozero operation AZ(Ub) of the other set of comparators is performed. Namely, this circuit configuration performs an operation equivalent to the operation accomplished when two units of the circuits of FIG. 4 are operated with a phase difference therebetween. The components such as the divider resistors and encoders can be naturally shared; consequently, the operation speed can be increased and the number of parts can be minimized.

In the comparators of FIGS. 3, 6, 7, 8, and 11, a current flows from $V_{DD}$ to $V_{SS}$ or a fixed current is constantly supplied from the constant-current power supply during the autozero period. To reduce the power dissipation of comparators, each comparator is desired to accomplish a compare operation with a current the magnitude of which is as small as possible. Taking other aspects also into consideration, a MOS comparator is quite favorable which operates with a low power dissipation and which is suitable for an integrated circuit.

To this end, a differential-type comparator is configured by use of a pair of clocked inverters to block the constant-current path, thereby minimizing the power dissipation. Two input voltages are subjected to the sample-and-hold operation at the input terminals of the clocked inverters, which are then activated; and then the difference voltage therebetween is amplified through a positive feedback loop and the compare result is outputted.

Figure 15:
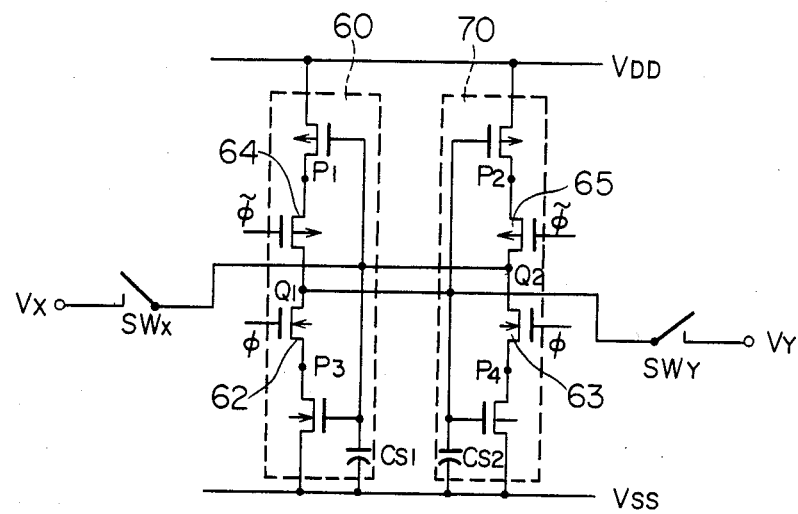
FIG. 15 is a circuit diagram illustrating a comparator configured by use of a clocked inverter.

FIG. 15 is a circuit diagram of a comparator including clocked inverters. The inputs and outputs of two clocked CMOS inverter,s 60 and 70 are respectively connected to form a latch. To an input of the inverter 60, an input voltage $V_x$ is applied via a switch $SW_x$. To an input of the inverter 70, an input voltage $V_y$, is applied via a switch $SW_y$.

Figure 16:
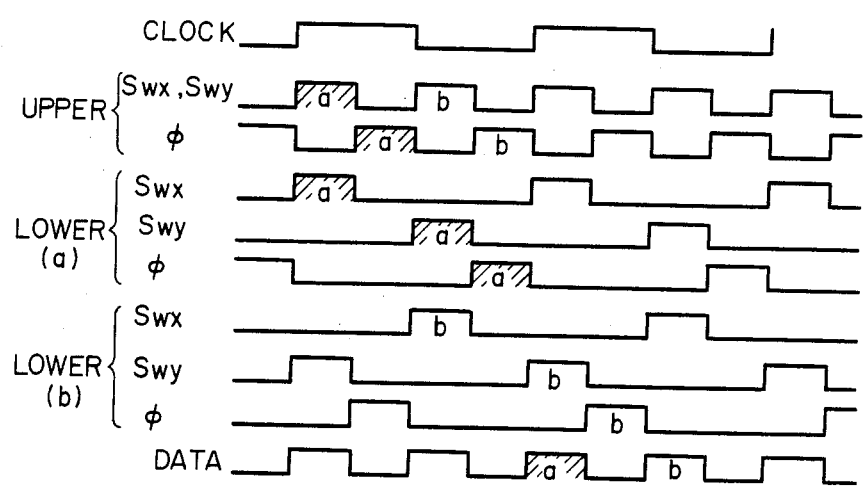
FIG. 16 is a timing chart showing the timing of operations in a case where the comparator of FIG. 15 is applied to the circuit of FIG. 4.

The comparator operation is performed according to the timing chart of FIG. 16. When the switches $SW_x$ and $SW_y$ are turned on, the input voltages $V_x$ and $V_y$ are respectively supplied. The potential of the nodes $Q_1$ and $Q_2$ changes to $V_y$ and $V_x$, respectively. A clock $\phi$ turns the MOS transistors 62-63 on and an inverse clock $\overline{\phi}$ simultaneously turns the MOS transistors 64-65 on, which then activates the clocked inverters 60-70 to operate the positive feedback loop depending on the relationships between $V_x$ and $V_y$, thereby determining the latch state. As a result, $Q_1$ and $Q_2$ are at the low and high levels, respectively for $V_x > V_y$ and are at the high and low levels respectively for $V_x < V_y$. That is, the result obtained by comparing $V_x$ with $V_y$ is outputted to the node $Q_1$ or $Q_2$. The output may be obtained from $P_1$, $P_2$, $P_3$, or $P_4$. The difference output can be obtained through branches on the right and left sides of the diagram.

This comparator has no path for a constant current and thus any current thereof is a transient current for charging or discharging, which makes it possible to reduce the power dissipation. This configuration is therefore suitable when a multiplicity of comparators are arranged in an apparatus such a series-parallel A/D converter.

FIG. 16 shows a timing chart applied when the comparator of FIG. 15 is used in the circuit of FIG. 4. In the comparators 10 for the high-order bits (FIG. 4), the input and reference signals are received while the clock is "1" (a in SWX, SWY), and then the conversion is achieved (a in $\phi$). On the other hand, in a comparator for the low-order bits (11a in FIG. 4), when the comparator for the high-order bits receive data (a in SWX, SWY), the data is simultaneously extracted (a in SWX); and after the CLOCK is set to the low level, the reference signal is received (a in SWY) and then the comparison is effected (a in $\phi$). In another comparator 11b for the low-order bits, the input signal is received when the CLOCK is set to the low level (b in SWX) and the reference signal is received when the CLOCK is set to the high level (b in SWY), and then the compare operation is executed (b in $\phi$). The output data is supplied after the respective compare operation is completed.

In the circuit of FIG. 15, the two inverters 60-70 each include four MOS transistors connected in series. The switch transistors controlling the clock signal need not necessarily be disposed for the respective inverters.

Figure 17:
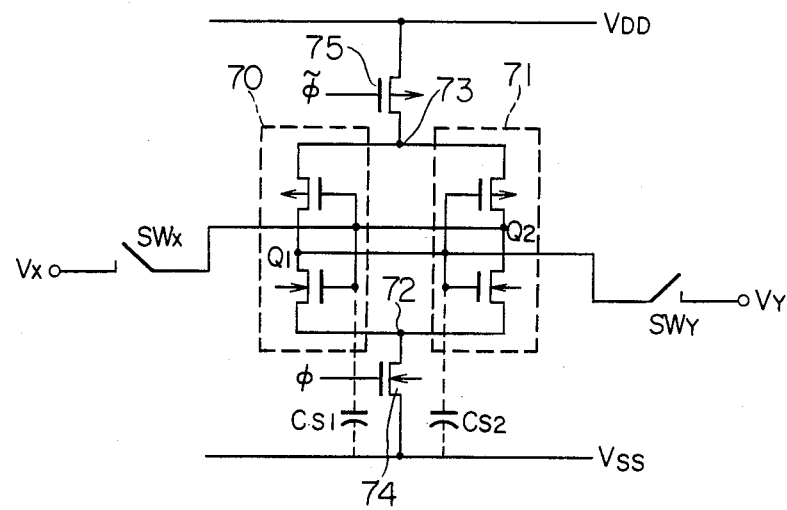
FIG. 17 is a circuit diagram illustrating a comparator in which the inputs and outputs of two inverters commonly connected to a switch MOS transistor are crosswise wired to form a latch circuit.

FIG. 17 is a circuit diagram of a comparator in which the inputs and outputs of two inverters sharing a switch MOS transistor are crosswise connected to form a latch configuration.

The inputs and outputs of the CMOS inverters 70-71 are respectively connected to form a latch circuit and the nodes 72-73 are connected to the power source lines $V_{SS}$ and $V_{DD}$, respectively through the clocked MOS switches 74 and 75, respectively, the switches 74-75 being controlled to be set to ON/OFF by the clock signals $\phi$ and $\overline{\phi}$, respectively. The input voltage $V_x$ is applied to the input of the inverter 70 via the switch $SW_x$ and the (reference) voltage $V_Y$ is applied to the input of the inverter 71 via the $SW_Y$. The operation of the circuit of FIG. 17 is completely the same as that of the circuit of FIG. 15.

In the comparators shown in FIGS. 15 and 17, the transistors connected between the power lines $V_{DD}$ and $V_{SS}$ are not simultaneously turned on and hence the power dissipation is lowered. Consequently, even if the number of comparators to be simultaneously connected in parallel in the A/D converter is increased, the power dissipation can be effectively minimized.

Figure 18:
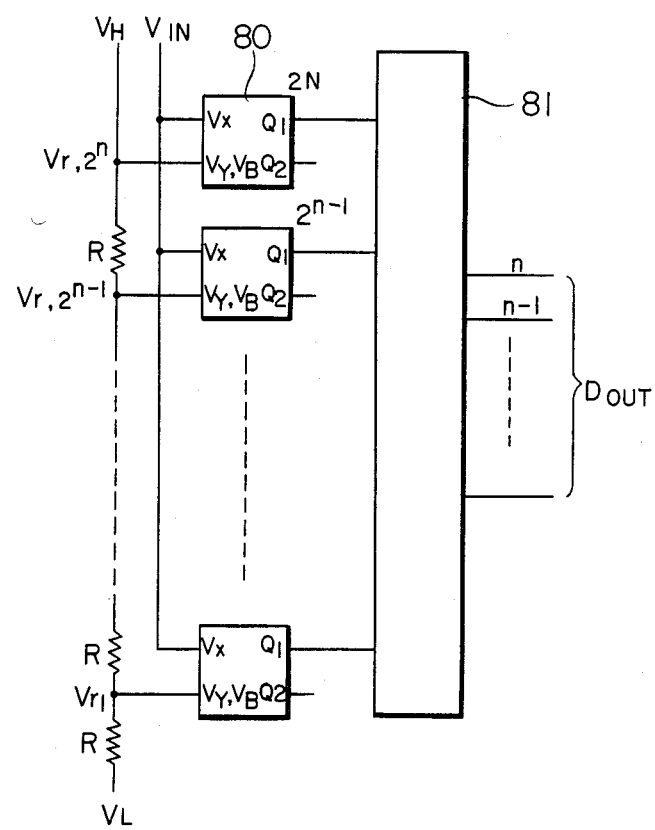
FIG. 18 is a circuit diagram depicting a circuitry in which the comparators of FIGS. 15-17 are connected in parallel.

FIG. 18 is a schematic circuit diagram in which the comparators of FIGS. 15 and 17 are connected in parallel.

A comparator 80 is similar to those shown in FIGS. 15 and 17, and by using $2^n$ units f such comparators, the input voltage $V_{in}$ is simultaneously compared with $2^n$ reference voltages $V_{Yi}$ ($i = 1, 2, \ldots, 2^n$). The compare result from each comparator 80 is encoded by an encoder 81 to generate a digital value $D_{out}$ comprising a predetermined number n of bits. Due to the low power dissipation of the comparator 80, even if the number of comparators to be connected in parallel is increased, for example, 256 comparators are integrated for an 8-bit configuration, the power dissipation will rarely become a problem.

Figure 19A:
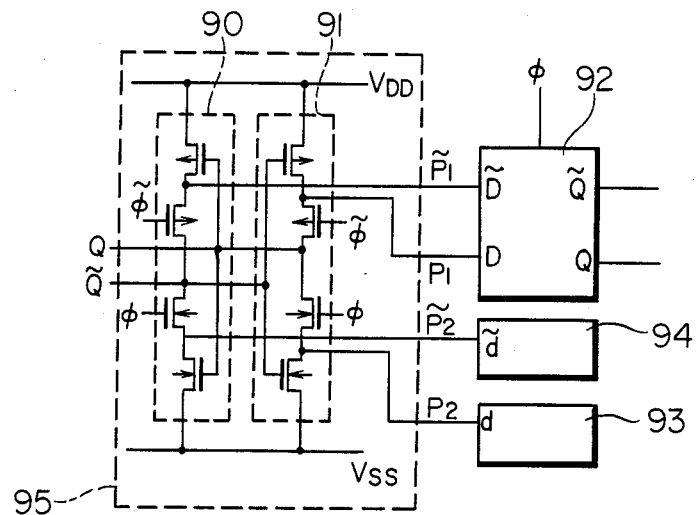
FIGS. 19A–19B are configuration examples showing a case where the comparator of FIG. 15 is combined with digital logic circuits.
Figure 19B:
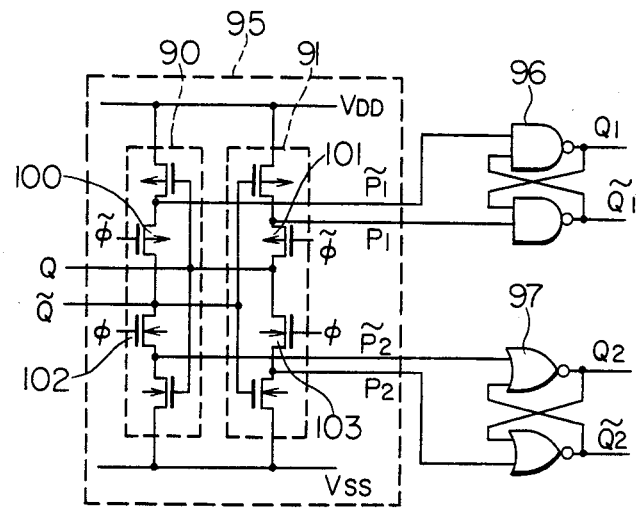

FIGS. 19A-19B show configuration examples in which the comparators of FIG. 15 are combine with digital logic circuits. A comparator 95 has outputs $P_1$, $\overline{P}_1$, $P_2$, and $\overline{P}_2$ which are directly connected to input terminals D and $\overline{D}$ of a D-type flip-flop 92 and input terminals d and $\overline{d}$ of digital logic circuits 93-94, respectively.

When the clocked inverters 90-91 are activated by a clock $\phi$, a positive feedback is applied thereto and then the outputs $P_1$, $\overline{P}_1$, $P_2$, and $\overline{P}_2$ are determined to be at the high or low level. Since the digital logic circuits 92-94 at the succeeding stage are not connected as a load to the input terminals Q and $\overline{Q}$ of the comparator 95, the load condition is improved in the design of the comparator and hence the performance design for the performance factors such as the accuracy and the operation speed is facilitated.

In the circuit of FIG. 19B, an RS flip-flop 96 comprising NAND gates is connected to the output terminals $P_1$ and $\overline{P}_1$ of the comparator 95 and an RS flip-flop 97 including NOR gates is connected to the output terminals $P_2$ and $\overline{P}_2$ thereof. On activation of the inverters 90-91 by the clock signals $\phi$ and $\overline{\phi}$, the output terminals $P_1$ and $P_2$ output the different voltage levels, which then determine the state of the RS flip-flop 96 and the predetermined outputs are delivered from the output terminals $Q_1$ and $\bar{Q}_1$. Next, when the clock signals $\phi$ and $\bar{\phi}$ are inverted and the MOS gates 100-103 are turned off in the inverters 90-91, the output terminals $P_1$ and $\bar{P}_1$ hold the previous states or are set to the high level ($V_{DD}$). In the latter case, the inputs of the NAND gates constituting the RS flip-flop are set to the high level, however, the previous states are retained. Consequently, the RS flip-flop 96 outputs the compare result from the comparator 95 in a stable fashion. This is also the case with the RS flip-flop 97 connected to the output terminals $P_2$ and $\bar{P}_2$.

Figure 20:
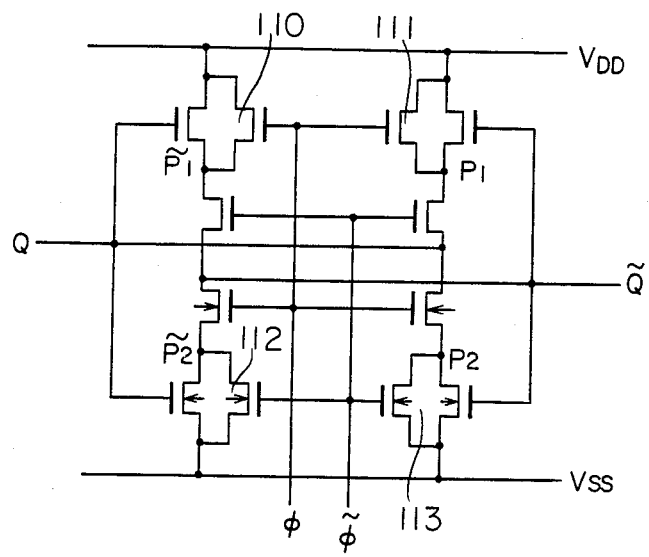
FIG. 20 is a circuit diagram illustrating an example in which MOS transistors are added to the circuit configuration of FIGS. 19A–19B to increase the operation speed.

FIG. 20 shows a circuit example configured by adding MOS transistors to the circuit configuration of FIGS. 19A-19B to improve the operation speed. PMOS's 110-111 and NMOS's 112-113 are respectively connected in parallel and are controlled to be set to ON/OFF according to the clocks $\phi$ and $\bar{\phi}$. If two input voltages are beforehand applied to input terminals Q and $\bar{Q}$, the clocks $\phi$ and $\bar{\phi}$ are set to the low and high levels, respectively. The PMOS's 110-111 are then turned on and the nodes $P_1$ and $\bar{P}_1$ are biased with a voltage $V_{DD}$, which causes the NMOS's 112-113 to turn on and thus the nodes $P_2$ and $\bar{P}_2$ are biased with a voltage $V_{SS}$. The bias speed is sufficiently high because the PMOS's 110-111 and NMOS's 112-113 are rapidly turned on by the clocks $\phi$ and $\bar{\phi}$.

Figure 21:
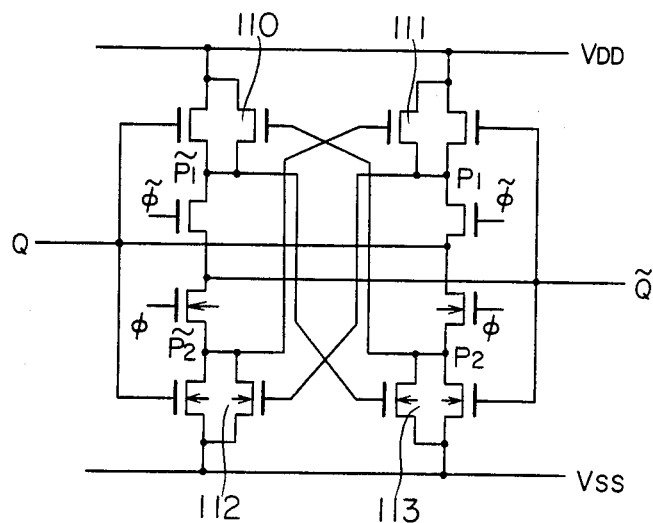
FIG. 21 is a circuit diagram showing an example in which the control means of the MOS transistors of the comparator circuit is changed.

FIG. 21 shows a circuit example in which the control means of the MOS transistors 110-113 of the comparator circuit shown in FIG. 20 is changed. The voltages at $P_2$ and $\bar{P}_2$ are directly applied to the gates of the PMOS transistors 110-111, respectively; whereas the voltages at $P_1$ and $\bar{P}_1$ are directly applied to the gates of the NMOS transistors 112-113. If the two input voltages are beforehand applied to the input terminals Q-$\bar{Q}$, the voltage remaining at $P_1$ and $\bar{P}_1$ are at a level sufficient enough to turn the NMOS's 112-113 on, while the voltages remaining at $P_2$-$\bar{P}_2$ are at a level sufficient to turn the PMOS's 110-111 on regardless of the previous compare results. This causes the NMOS's 112-113 to turn on and the nodes $\bar{P}_2$-$P_2$ are changed to be at the potential on the $V_{SS}$ side, which further sets the PMOS's 111-112 to ON and hence the potential at $P_1$-$\bar{P}_1$ is caused to approach $V_{DD}$. This positive feedback enables a high-speed initial reset operation to set the respective sections to the initial voltages.

Figure 22:
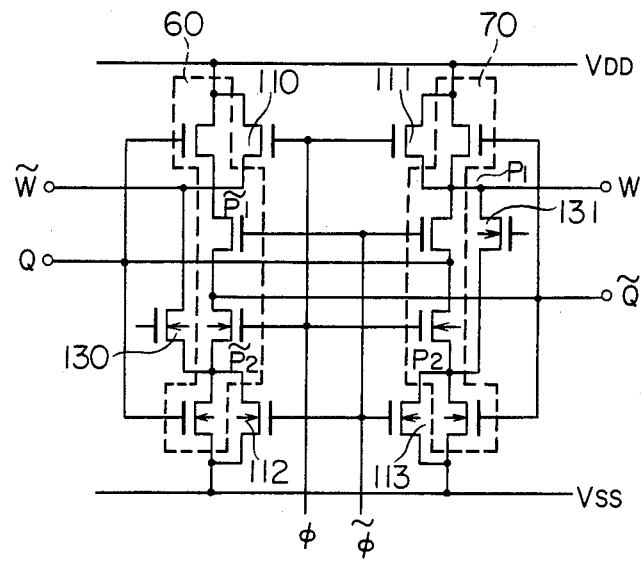
FIG. 22 is a circuit diagram depicting an example of a comparator implemented by adding MOS transistors to the comparator of FIG. 20.

FIG. 22 shows an example of a comparator implemented by adding MOS transistors between $P_1$ and $P_2$ and between $\bar{P}_1$ and $\bar{P}_2$, respectively. An NMOS comparator 130 is connected between $\bar{P}_1$ and $\bar{P}_2$, whereas an NMOS comparator 131 is linked between $P_1$ and $P_2$. These comparators are controlled to be set to ON/OFF by the clocks $\phi$ and $\bar{\phi}$; namely, during the initial reset period after the input voltages are applied, these comparators are set to OFF. During the compare period following the initial reset period, these comparators are turned on to make the paths between $P_1$ and $P_2$ and between $\bar{P}_1$ and $\bar{P}_2$ conductive, which helps increasing the operation speed of the positive feedback loop comprising the clocked inverters 60 and 70. This further serves to sufficiently decrease the voltages associated with the low-level outputs W and $\bar{W}$. A PMOS gate may be used in place of the NMOS gate, or the NMOS and PMOS gates may be utilized in the same circuit configuration. The outputs may also be extracted from the nodes $P_2$ and $\bar{P}_2$.

Figure 23:
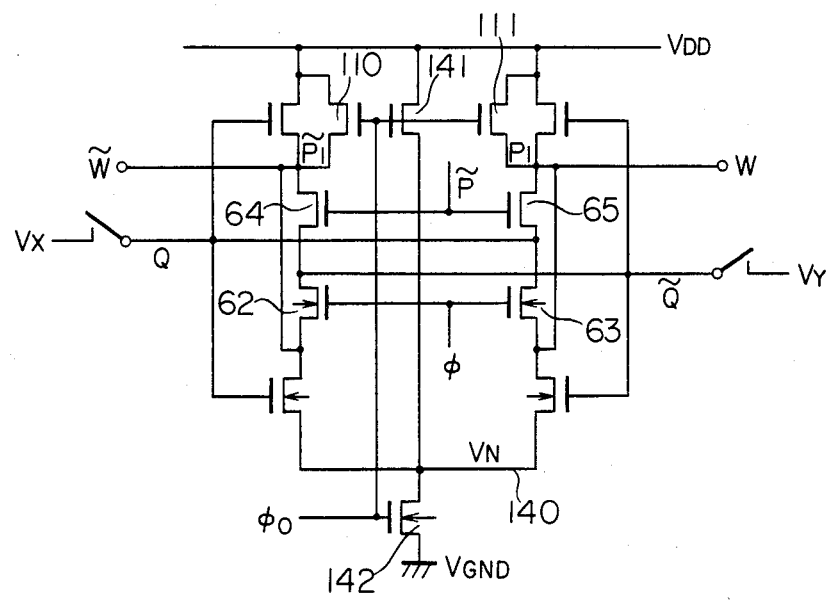
FIG. 23 is a circuit diagram illustrating an example of another circuit configuration of the comparator.

FIG. 23 shows another circuit diagram of a comparator in which the NMOS gates 130-131 are removed from the clocked inverters 60-70, respectively of FIG. 22 to $\bar{p}_1$ to $P_2$ and $P_1$ to $\bar{P}_2$, then the NMOS gates 112-113 for setting the initial voltages are removed, and the $V_n$ line 140 can be changed over between a voltage $V_{DD}$ (high potential) and a voltage $T_{GND}$ (low potential) by use of a PMOS gate 141 and an NMOS gate 142.

During the initial reset period where the input voltages $V_x$ and $V_y$ are applied to Q and $\bar{Q}$, respectively; clocks $\phi_0$, $\phi$ and $\bar{\phi}$ are at the low, low, and high levels, respectively and hence the nodes $P_1$, $\bar{P}_1$, and $V_N$ line 140 are set to the power voltage $V_{DD}$. The NMOS gates 62-63 and PMOS gates 64-65 are turned off by $\phi$ and $\bar{\phi}$; respectively to insulate Q and $\bar{Q}$ from the other components; as a result, Q and $\bar{Q}$ are set to $V_x$ and $V_y$, respectively. Next, during the compare period, $\phi_0$, $\phi$, and $\bar{\phi}$ are set to the high, high, and low levels, respectively, the $V_N$ line is connected to the power voltage $V_{GND}$, the PMOS gates 110-111 turn off, the PMOS gates 64-65 and NMOS gates 62-63 turn on, and then a positive feedback loop for rapidly amplifying the difference between the input voltages $V_x$ and $V_y$ operates and hence the compare results are outputted to W and $\bar{W}$. Since the transient current flows only during a slight period of time, namely, the initial reset period and the compare period, the power dissipation is sufficiently minimized. In addition, the positive feedback operation makes it possible to achieve a high-speed compare operation.

Figure 24:
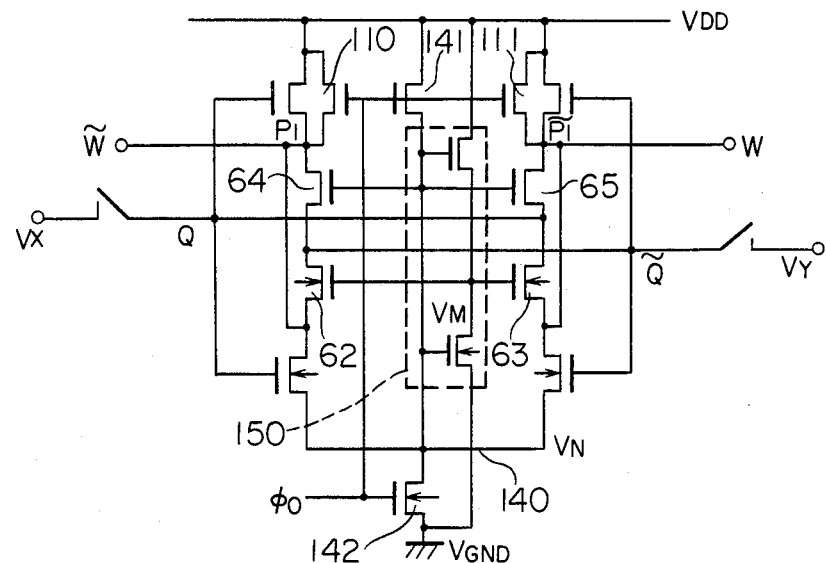
FIG. 24 is a circuit diagram showing a circuit example in which the comparator of FIG. 23 is partially modified.

FIG. 24 shows a circuit example implemented by partially modifying the comparator of FIG. 23. The voltage $V_N$ 140 and the voltage $V_M$ obtained by inverting $V_N$ through a CMOS inverter 150 are used in place of the clocks $\phi$ and $\bar{\phi}$, respectively.

Figure 25:
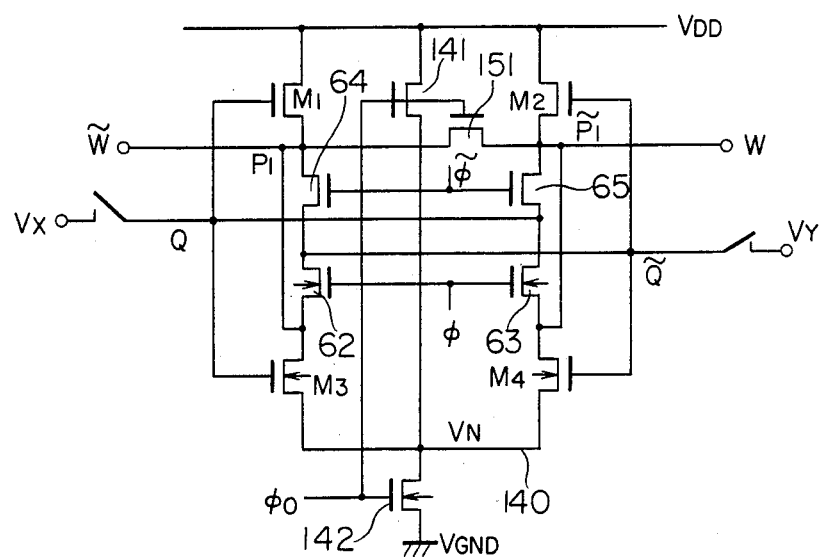
FIG. 25 is a circuit diagram depicting another circuit example in which the comparator of FIG. 23 is partially modified.

FIG. 25 is another circuit example in which the comparator of FIG. 23 is partially modified. The PMOS gates 110-111 of the circuit of FIG. 23 are removed and a PMOS gate 151 is utilized in place thereof to set the initial voltages at $P_1$ and $\bar{P}_1$ to the same potential. The initial potential is set to the power voltage $V_{DD}$ by use of four MOS gates M1-M4. Although the ON/OFF states of the four MOS gates M1-M4 are determined by the levels of the input voltages $V_x$ and $V_y$, at least two MOS gates are on in an ordinary case, which enables the initial voltage to be set.

We claim:

1. An analog-to-digital (A/D) converter comprising:
    means for supplying coarse division voltages coarsely dividing a voltage range to be subjected to an A/D conversion;
    a coarse compare circuit for comparing analog input voltages with said coarse division voltages and for outputting coarse compare results corresponding to higher order bits and indicating to which one of partitions of the voltage region each said analog input voltage belongs;
    means for supplying fine division voltages finely dividing a partition of the voltage range depending on said coarse compare results from said coarse compare circuit;
    a fine compare circuit for comparing said analog input voltages with said fine division voltages and for outputting fine compare results corresponding to lower order bits and indicating to which one of finely divided portion of the voltage range each said analog input voltage belongs, said fine compare circuit including plural groups of fine comparators, each of which groups being capable of functioning as an independent comparison circuit for the lower order bits and of being alternately operated;

means for sequentially selecting fine compare results from alternate ones of said plural groups of fine comparators;

means for controlling said fine compare circuit to sequentially supply said analog imput voltage to one of said plural groups of fine comparators; and means for generating a digital output signal corresponding to said analog input voltages based on said coarse compare results and said fine compare results.

2. An A/D converter according to claim 1 wherein each group of fine comparators includes a plurality of comparators.

3. An A/D converter according to claim 2 wherein each said comparator operates to store said analog input voltage.

4. An A/D converter according to claim 2 wherein each group of fine comparators includes means for holding an input voltage, common to the fine comparators.

5. An A/D converter according to claim 2 wherein each of said comparators includes a plurality of insulated-gate field effect transistors (IGFET's) connected in series and at least one of said IGFET's is controlled to be turned on/off by a clock signal.

6. An A/D converter according to claim 5 wherein said series connection includes four IGFET's and two IGFET's thereof are controlled to be turned on/off by clock signals.

7. An A/D converter according to claim 2 wherein each of said comparators includes a pair of inverters each being controlled by a clock signal and an output from one of the inverters is linked to an input of the other inverter thereof.

8. An A/D converter according to claim 2 wherein each of said comparators includes a differential amplifier and a switch element which is connected between said differential amplifier and a power supply line and which is controlled to be turned on/off by a clock signal.

9. An A/D converter comprising:
a series of voltage dividing resistors including a plurality of resistors connected in series;
a first group of comparators for comparing an input voltage with coarse division voltages from said series of resistors;
a first encoder for encoding a comparison result from said first comparator group;
a group of switches controlled by an output from said first encoder for selecting fine division voltages from said series of resistors;
a second group of comparators for comparing an input voltage with the fine division voltages selected by said switch group, said second comparator group being synchronized with said first comparator group and including at least two sets of comparator groups each being alternately operated;
a second encoder for encoding a comparison result from said second comparator group; and
circuit means connected between said second comparator group and said second encoder for alternately selecting outputs from said two sets of second comparator groups and for inputting the outputs to said second encoder.

10. An A/D converter according to claim 9 further comprising sample-and-hold circuits disposed at input of said two sets of comparator groups.

11. A A/D converter according to claim 9, wherein said comparators include a comparator comprising:
a first clocked inverter;
a second clocked inverter;
means for supplying at least a voltage to an input of said first clocked inverter and an output said second clocked inverter, said input of the first clocked inverter being connected to said output of second clocked inverter; and
means for supplying at least a voltage to an output of said first clocked inverter and an input of said second clocked inverter, said output of the first clocked inverter being connected to said input of the second clocked inverter.

12. An A/D converter according to claim 11 wherein each of said first and second clocked inverters includes a series connection of a first MOS transistor, a second MOS transistor, a third MOS transistor, and a fourth MOS transistor in this sequence, said first and second MOS transistor being of a same polarity and said third and fourth MOS transistors being of the opposite porality to that of said first and second MOS transistors, wherein said first and fourth MOS transistors have their gates connected to each other to establish an input terminal, the second and the third MOS transistors are clock-controlled the phase of a clock supplied to said second MOS gate is opposite to a phase of a clock supplied to said third MOS gate, and a connecting point between the second and third MOS transistors, between the first and second MOS transistors, or between the third and fourth MOS transistors is used as an output terminal.

* * * * *